United States Patent

Wada et al.

[11] Patent Number: 5,329,335
[45] Date of Patent: Jul. 12, 1994

[54] METHOD AND APPARATUS FOR PROJECTION EXPOSURE

[75] Inventors: Toshio Wada; Hiroyuki Inoue; Kouhei Eguchi, all of Sagamihara, Japan

[73] Assignee: Nippon Steel Corporation, Tokyo, Japan

[21] Appl. No.: 32,319

[22] Filed: Mar. 17, 1993

[30] Foreign Application Priority Data

Mar. 17, 1992 [JP] Japan .................................. 4-091872
Mar. 17, 1992 [JP] Japan .................................. 4-091873

[51] Int. Cl.$^5$ .............................................. G03B 27/52
[52] U.S. Cl. ........................................ 355/53; 355/77
[58] Field of Search ............... 430/5; 355/53, 67, 70, 355/43, 77; 356/401

[56] References Cited

U.S. PATENT DOCUMENTS

| | | | |
|---|---|---|---|
| 4,734,745 | 3/1988 | Ohta | 355/45 |
| 5,097,291 | 3/1992 | Suzuki | 355/69 |
| 5,144,362 | 9/1992 | Kamon et al. | 355/53 |
| 5,246,800 | 9/1993 | Muray | 430/5 |
| 5,253,040 | 10/1993 | Kamon et al. | |

OTHER PUBLICATIONS

24th VLSI the Front of Lithography, Feb. 1991.

*Primary Examiner*—Richard A. Wintercorn
*Attorney, Agent, or Firm*—Pollock, Vande Sande & Priddy

[57] ABSTRACT

Disclosed are a projection exposure method which comprises the steps of projecting patterns of first and second photo mask elements by a light including a coherent component, each photo mask element having a pattern of a single-layer structure of one of the phase shift film and the light shielding film on a substrate disposed at a predetermined position such that an optically synthesized pattern of the two patterns is formed on the substrate, and controlling a phase of at least one of a first light portion which projects the pattern of the first photo mask element on the substrate and a second light portion which projects the pattern of the second photo mask element on the substrate, such that said first and second light portions have a predetermined phase difference therebetween and a projection exposure apparatus for carrying out the abovementioned method.

15 Claims, 10 Drawing Sheets

METHOD AND APPARATUS FOR PROJECTION EXPOSURE

FIELD OF THE INVENTION

The present invention generally relates to method and apparatus for projection exposure and, more particularly, to method and apparatus for projection exposure in which a photo mask pattern is projected and exposed to a photosensitive material film on a wafer substrate in a fabricating process of semiconductor devices.

BACKGROUND OF THE INVENTION

In a conventional projection exposure apparatus utilized in a fabricating process of semiconductor devices, as shown in FIG. 13, a photo mask 52 that is disposed at a focusing position on an optical axis is radiated with a light from a light source 51. Then, a pattern of the photo mask pattern 52 thus radiated is projected onto and exposed to a photoresist on a wafer 54 (or a variety of thin films formed on the wafer 54) by means of a projection lens 53.

As shown in FIG. 14(a), the photo mask 52 is formed such that a pattern 522 of a film made of a light-shielding material such as a chromium film is formed on the surface of a glass substrate 521 made of a material such as a quartz glass.

When such a photo mask 52 is utilized, laser beams passed through transmission portions 523 where no light-shielding film 522 is provided are spread wider than the mask pattern on the wafer 54 because of the restriction by the resolution limit in the projection lens 53. Since the passed laser beams are the same in phase, a mutual action acts to increase their intensities, thereby producing an intensity-distribution on the wafer 54 such that, as shown in FIG. 14(c), two adjacent portions of the pattern cannot be separated. In the case of the reduction projection, the pattern of the photo mask 52 is reduced and then projected onto the wafer. The widths of the light shielding portion 522 and the transmission portion 523 are generally wider than 0.3 to 0.5 $\mu$m, when converted to the dimensions on the wafer.

Recently, a phase shift method which can improve a resolution only by changing the photo mask without changing the projection exposure apparatus receives a remarkable attention. The phase shift method is described, for example, in 24th VLSI Forum, the Front of Lithography, "Present Situation of Phase Shift Lithography" reported by Kyoto Research Laboratory, Matsushita Communication Industrial Co., Ltd. Yoshihiro Toshyo (1991), pp. 13–25.

As shown in FIG. 15(a), when the phase shift mask 55 utilized in this phase shift method is typically formed in a Levenson type, for example, such that the pattern of the light shielding film 552 is formed on the surface of a glass substrate 551 formed of a quartz glass or the like and a phase shift film 554 formed of a transparent thin film is formed on every other one of the transmission portions 553 where the light shielding film 552 is not provided.

When such phase shift mask 55 is utilized, as shown in FIG. 15(b), laser beams passed through the respective transmission portions 553 where the phase shift film 554 is formed are inverted in phase relative to the laser beams passed through the respective transmission portions 553 where no phase shift film 554 is formed. A mutual action acts on the boundaries between the respective passed laser beams so that they are weakened by each other at the boundaries in intensity of light. Consequently, as shown in FIG. 15(c), the light intensities at the boundaries between every adjacent two portions of the patterns on the wafer 54 become zero and the respective adjacent pattern portions are separated.

As described above, according to the phase shift method utilizing the phase shift mask 55, the phase of the passed laser beam is inverted, whereby a very fine pattern which can not be resolved by using the above-mentioned usual photo mask 52 can be resolved.

However, when the phase shift mask of a two-layer structure having the light shielding film 552 and the phase shift film 554 is manufactured, extremely high accuracy is required in a film thickness control. Hence, as compared with the photo mask 52 of single layer structure having only the light shielding film 552, the phase shift mask 55 is difficult to manufacture and involves a high manufacturing cost.

Further, the phase sight mask 55 involves a problem such that if the phase shift film 554 has a defect, even though it is a very small defect, it is transferred, as a pattern, to the wafer and therefore, it is important to inspect and correct any defect, but the inspection and correction are not easy.

Accordingly, the phase shift method utilizing the phase shift mask 55 raises a manufacturing cost and involves difficult problems to be solved, which prevents the phase shift method from being practically applied to a process of manufacturing the semiconductor devices.

SUMMARY OF THE INVENTION

An object of the present invention is to provide a method and apparatus for projection exposure in which a photo mask of a two-layer structure having both a phase shift film and a light shielding film is not utilized and two independent photo masks, each photo mask having a pattern of a single-layer structure of one of the phase shift film and the light shielding film, are utilized to thereby achieve substantially the same effect as that of the phase shift method.

To achieve this object, according to the present invention, there is provided a projection exposure method which comprises the steps of projecting patterns of first and second photo mask elements, each photo mask element having a pattern of a single-layer structure of one of the phase shift film and the light shielding film, by a light including a coherent component onto a substrate disposed at a predetermined position such that an optical synthesized pattern of the two patterns is formed on the substrate, and controlling a phase of at least one of a first light portion, by which the pattern of the first photo mask element is projected on the substrate and a second light pattern, by which the pattern of the second photo mask element is projected onto the substrate so that the first and second light portions have a predetermined phase difference therebetween.

According to the present invention, there is provided a projection exposure apparatus which comprises a light source for emitting a light including a coherent component, first and second photo mask elements, each having a pattern of a single-layer structure of one of a phase shift film and a light shielding film, means for mounting and positioning a substrate at a predetermined position, means for projecting the patterns of the first and second photo mask elements by a light including a coherent component such that an optically synthesized pattern of the two patterns is formed on the substrate, and means for controlling a phase of at least one of a first light portion, by which the pattern of the first photo mask element is projected onto the substrate, and a second light portion, by which the pattern of the second photo mask element is projected onto the substrate, so that the first and second light portions have a predetermined phase difference therebetween.

According to an embodiment of the present invention, there is provided a projection exposure method which comprises the steps of focusing an image of a first pattern formed on a first photo mask element at a first predetermined position by using a light including a coherent component, and projecting and exposing an optical synthesized pattern of a second pattern formed on a second photo mask element disposed at the predetermined position and the focused first pattern of the first photo mask element on a substrate disposed at a second predetermined position by using the light, wherein one of the first and second patterns is formed of a light shielding film and the other pattern corresponds to at least one selected portion of the one pattern and is formed of a phase shift film.

According to another embodiment of the present invention, there is provided a projection and exposure apparatus which comprises a light source for emitting a light including a coherent component, photo mask means including a first photo mask element having a predetermined first pattern formed thereon and a second photo mask element having a predetermined second pattern formed thereon, and means for focusing an image of the first pattern on the second photo mask by using the light from the light source and projecting and exposing an optical synthesized pattern of the focused first pattern and the second pattern of the second photo mask element on a substrate disposed at a predetermined position, wherein one of the first and second patterns is formed of a light shielding film and the other pattern corresponds to at least one selected portion of the one pattern and is formed of a phase shift film.

According to a further embodiment of the present invention, there is provided a projection and exposure method which comprises the steps of splitting a light from a light source into first and second lights transmitted through two different optical paths, controlling a phase of at least one of the first and second lights so that the first and second lights have a predetermined phase difference therebetween, disposing photo mask means including first and second photo mask elements having first and second predetermined patterns, respectively, which provide a predetermined pattern when optically synthesized, such that the first light passes through the first photo mask element and the second light passes through the second photo mask element, synthesizing the first light after being transmitted through the first photo mask element and the second light after being transmitted through the second photo mask element to form a synthesized light carrying the predetermined pattern and projecting and exposing the synthesized pattern onto a substrate.

According to another further embodiment, there is provided a projection and exposure apparatus which comprises means for splitting a light produced from a light source and including a coherent component into first and second lights transmitted through two different optical paths, means for controlling a phase of at least one of the first and second lights so that the first and second lights have a predetermined phase difference therebetween, photo mask means including first and second photo mask elements having first and second patterns, respectively, which provide a predetermined synthesized pattern when optically synthesized, and disposed such that the first light is transmitted through the first photo mask element and the second light is transmitted through the second photo mask element, means for optically synthesizing the first light transmitted through the first photo mask element and the second light transmitted through the second photo mask element to form a synthesized light carrying the predetermined pattern and means for projecting and exposing the synthesized light on a substrate.

In the first embodiment of the present invention, the first pattern of the first photo mask element is focused on the second photo mask element, and the synthesized pattern of the first pattern and the second pattern of the second photo mask element is projected on the substrate to expose the substrate. In addition, one of the first and second patterns is formed by a single-layer structure of the light shielding film, while the other pattern corresponds to the selected portion of the one pattern and is formed of a single-layer structure of the phase shift film. The light that projects the selected portion of the first pattern is controlled in phase by the phase shift film of the second pattern formed on the other photo mask. Therefore, the same effects as those of the phase shift method can be realized without utilizing the photo mask of two-layer structure having the light shielding film and the phase shift film.

In the further embodiment of the present invention, the light including a coherent component from the light source is split into first and second lights by the splitting means, and the phase difference is provided between the first and second lights by the phase control means. These first and second lights are transmitted through the first and second photo mask elements, respectively, so that the photo mask element through which the phase-controlled light is transmitted functions as the phase shift mask. Then, the synthesizing means synthesizes the first and second lights as transmitted through the first and second photo mask elements to form a synthesized pattern of the respective patterns of the first photo mask element and the second photo mask element. This synthesized pattern is projected to expose the substrate by the optical means.

Accordingly, the phase shift method can be realized by utilizing the two photo mask elements having the pattern formed of only the light shielding film.

The above and other objects, features, and advantages of the present invention will become apparent from the following detailed description of illustrative embodiments thereof in conjunction with the accompanying drawings.

DESCRIPTION OF THE PREFERRED EMBODIMENTS

An embodiment of the present invention, which is applied to method and apparatus for reducing projection exposure will be described with reference to the accompanying drawings.

Figure 1:
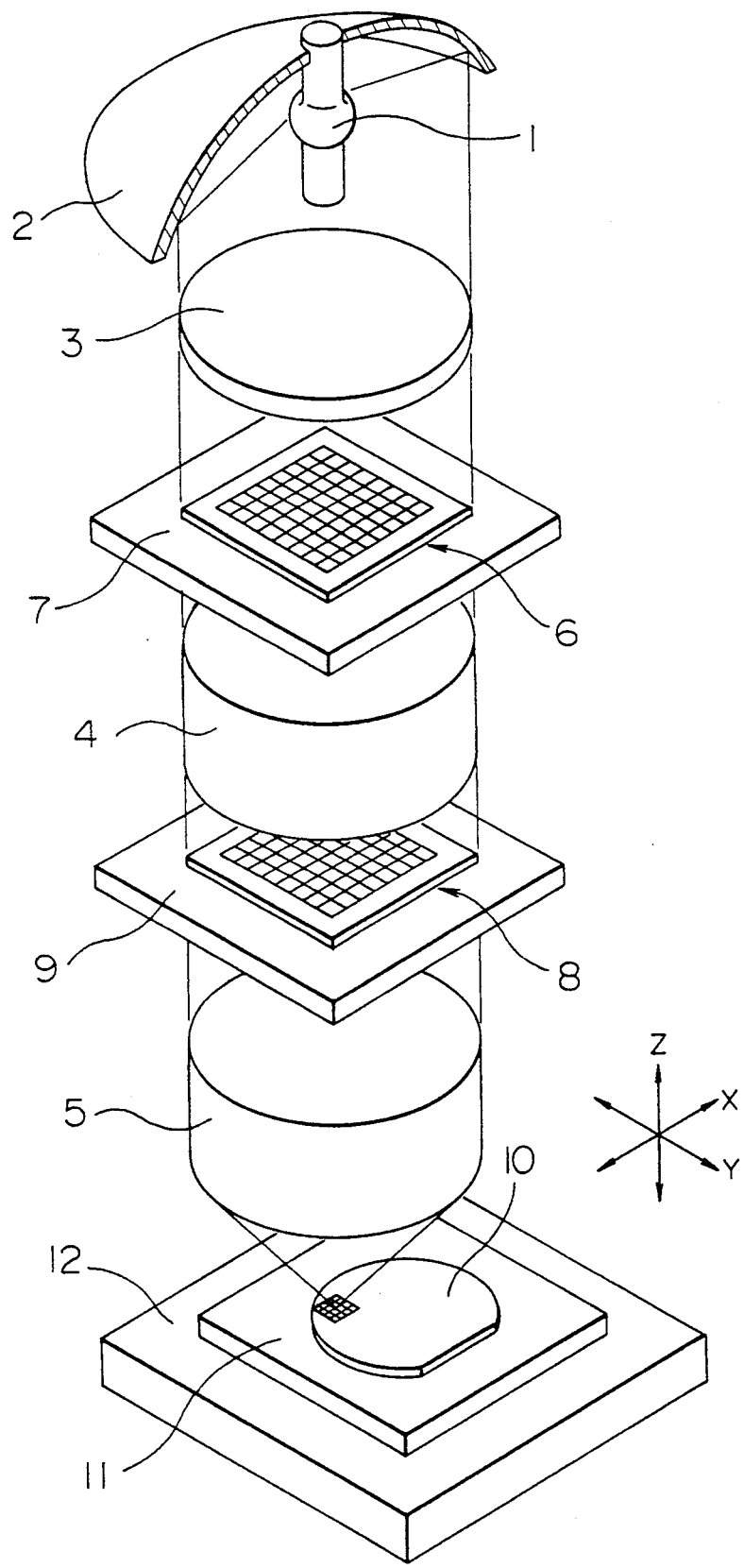
FIG. 1 is a perspective view schematically showing an arrangement of a projection exposure apparatus according to a first embodiment of the present invention.

As shown in FIG. 1, the apparatus of this embodiment comprises an illumination optical system including a light source 1 formed of an ultra-high pressure Hg lamp (i rays) for emitting a partial coherent light, an ellipsoidal collector 2, a condenser lens 3 or the like, an intermediate projection optical system including a magnification projection lens 4 and an object projection optical system including a reduction projection lens 5.

A mask mount 7 for holding the first photo mask 6 is disposed between the condenser lens 3 and the magnification projection lens 4 and a mask mount 9 for holding a second photo mask 8 is disposed between the magnification projection lens 4 and the reduction projection lens 5. A wafer chuck 11 for holding a wafer 10 is supported on an XY stage 12 and disposed under the reduction projection lens 5.

Each of the mask mounts 7 and 9 each is movable by a very small amount in the X, Y, Z directions and also adjustable for rotation and inclination in the XY plane. Thus, the first and second photo masks 6 and 8 can be accurately disposed at different focusing positions on the optical axis of the magnification projection lens 4.

FIGS. 2 and 3 show the first photo mask 6 and the second photo mask 8 which are utilized when an example of the Levenson-type method, that is the typical phase shift method is realized by the method, and apparatus of this embodiment.

Figure 2A:
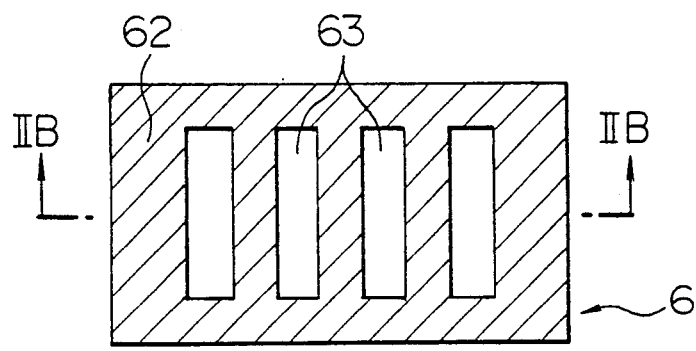
FIG. 2A is a plan view of a first photo mask element utilized in the present invention.
Figure 2B:
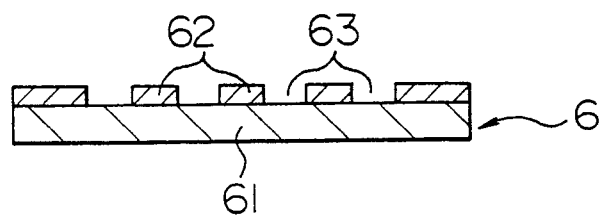
FIG. 2B is a cross-sectional view taken along the line IIB—IIB of FIG. 2A.
Figure 3A:
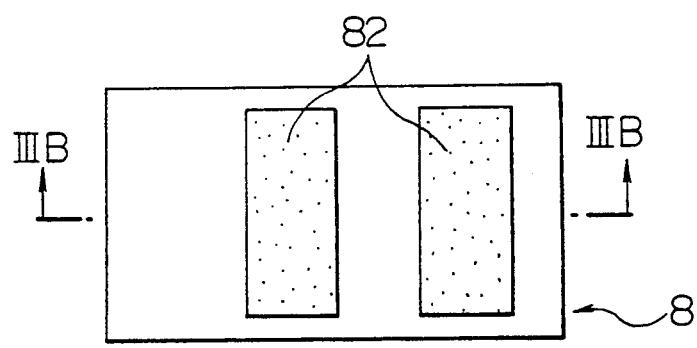
FIG. 3A is a plan view of a second photo mask element utilized in the present invention.
Figure 3B:
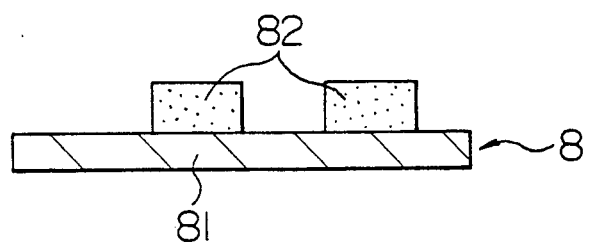
FIG. 3B is a cross-sectional view taken along the line IIIB—IIIB of FIG. 3A.

As shown in FIGS. 2A and 2B, the first photo mask 6 includes a pattern of a film 62 of a light shielding material such as chromium formed on the surface of a glass substrate 61 made of a quartz glass or the like. Also, as shown in FIGS. 3A, 3B, the second photo masks 8 includes a pattern of a phase shift film 82 of a transparent thin film formed on the surface of a glass substrate 81 made of a quartz glass or the like. The first and second photo masks 6 and 8 to be used for reduction projection exposure according to this embodiment have enlarged patterns, which are generally called an enlarging mask or reticle.

Figure 4:
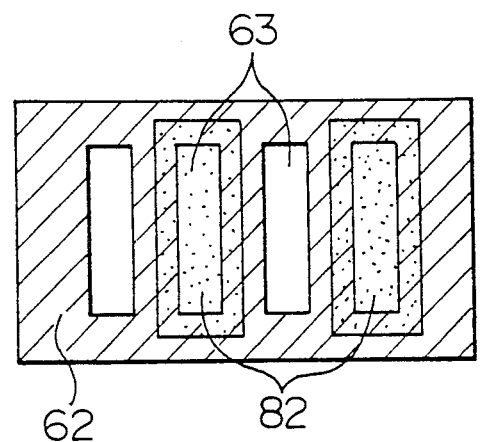
FIG. 4 is a diagram showing a relationship in optical position between the first pattern of the first photo mask element and the second pattern of the second photo mask element of FIGS. 2A and 2B.

As shown in FIG. 4, the first and second photo masks 6 and 8 are disposed so that the portion of the phase shift film 82 of the second photo mask 8 is optically overlapped on every other one of transmission portions 63, where the light shielding film 62 is not formed of the first photo mask 6.

According to the apparatus of this embodiment, as shown in FIG. 1, a partial coherent light from the light source 1 uniformly illuminates the first photo mask 6 through the ellipsoidal mirror 2, the condenser lens 3 or the like, whereby the pattern of the first photo mask 6 is focused by the magnification projection lens 4 at the position of the second photo mask 8. Therefore, the pattern of the first photo mask 6 and the pattern of the second photo mask 8 are synthesized and the synthesized pattern is projected in reduced size by the reduction projection lens 5 on the wafer 10 (or various thin films already formed on the wafer 10). While the wafer 10 is sequentially moved in each of the X and Y directions by the XY stage 12, the reduction projection is repeated so that the whole surface of the wafer 20 is exposed by the repetition of the above step.

Figure 5:
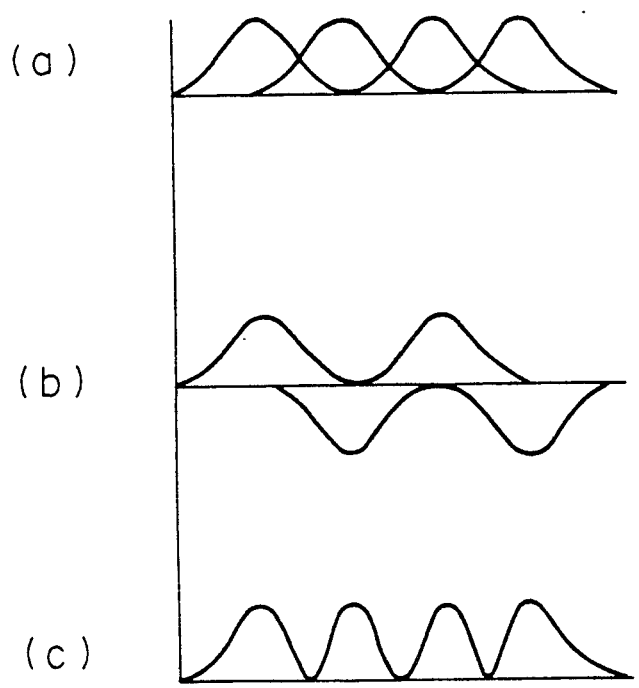
FIGS. 5(a), 5(b) and 5(c) are diagrams showing a distribution of intensity of light transmitted through the pattern of the first photo mask element, a distribution of intensity of light passing the pattern of the second photo mask element and a distribution of intensity of a synthesized light, respectively.

In the above projection exposure, as shown in FIG. 5(a), if only the first photo mask 1 is projected, the intensities of lights transmitted through the respective transmission portions 63 would be distributed on the wafer 10 with the same phase. However, the first and second photo masks 6 and 8 are projected in a overlapping relationship with each other, whereby the pattern of the first photo mask 6 and the pattern of the second photo mask 8 are optically synthesized. Therefore, as shown in FIG. 5(b), a part of the light transmitted through the respective transmission portions 63 of the first photo mask 63 is transmitted through the the respective phase shift films 82 of the second photo mask 8 and inverted in phase relative to the other part which is not transmitted through the phase shift film 82. In the light intensity on the wafer 10, as shown in FIG. 5(c), the light intensities at the boundaries of every adjacent two portions of the pattern become zero and the respective pattern portions are separated. A study of FIGS.

5(b) and 5(c) reveals that the same effect as that of the phase shift method using the phase shift mask 55 of two-layer structure shown in FIG. 17 can be realized by utilizing the first photo mask 6 of a single-layer structure and the second photo mask 8 of a single-layer structure.

While the mask having only the light shielding film is utilized as the first photo mask and the mask having only the phase shift film is utilized as the second photo mask as described above, these masks may be utilized vice versa. While the i-ray Hg lamp is used as the light source as described above, it is apparent that similar effects may be achieved by using a g-ray Hg lamp, an excimer laser light source or the like.

As described above, according to the embodiment of the present invention, the first photo mask pattern and the second photo mask pattern are synthesized and projected by utilizing the photo mask of single-layer structure having only the light shielding film and the phase shift mask of single-layer structure having only the phase shift film, thereby realizing the same effects as those achieved when the conventional phase shift mask of two-layer structure having the light shielding film and the phase shift film is utilized. Accordingly, instead of the conventional complex phase shift mask of two-layer structure of which the manufacturing process, the inspection and correction of defects are difficult, it is possible to use the photo mask (for example chromium mask) of single-layer structure and the phase shift mask of a single-layer structure, which can be manufactusred readily by the single-layer resist process. Therefore, it becomes possible to greatly reduce the cost required for the phase shift method and to effectively apply the phase shift method to the manufacturing process of semiconductor devices in actual practice.

Figure 6:
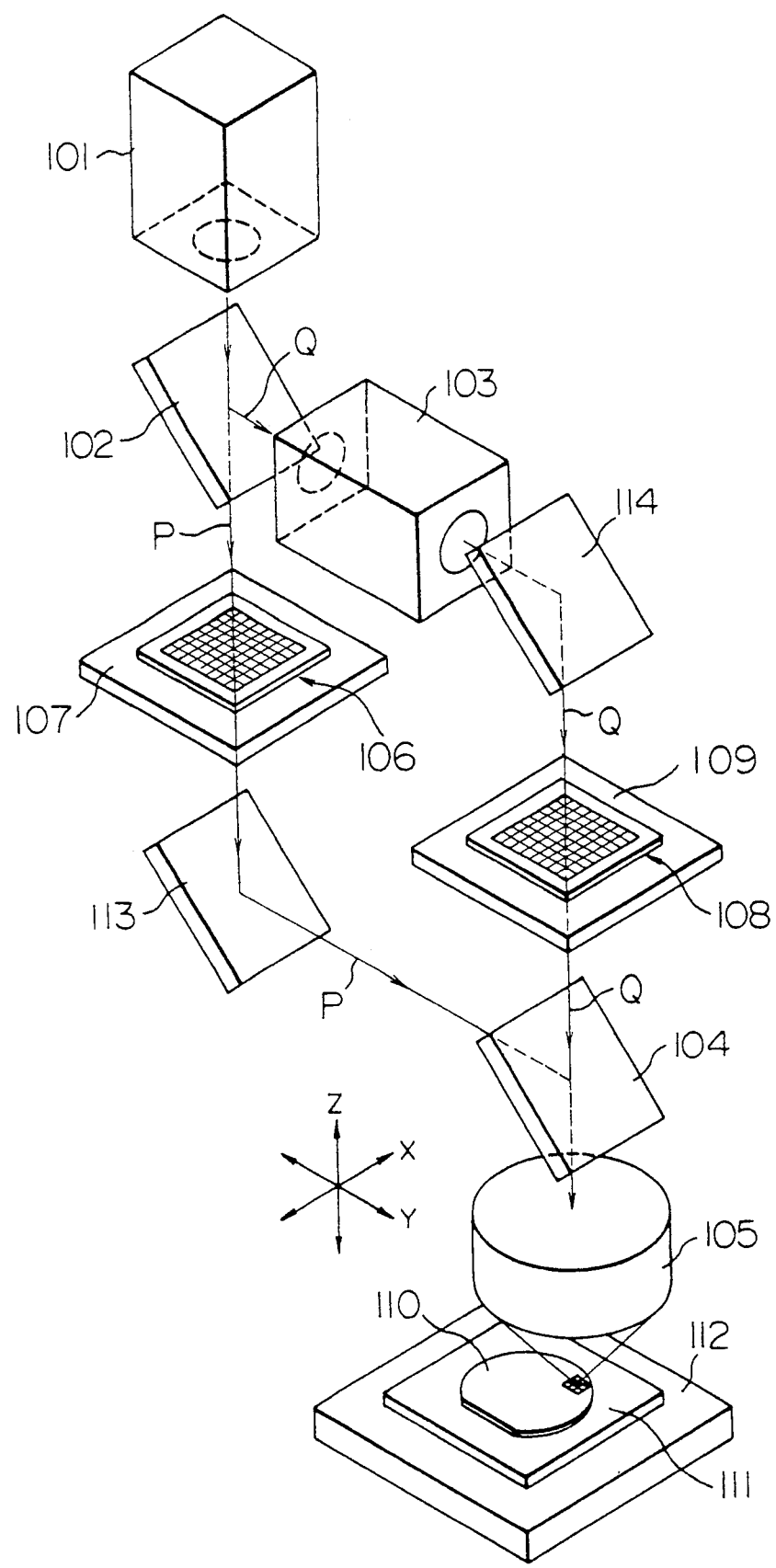
FIG. 6 is a perspective view schematically showing an arrangement of a projection exposure apparatus according to a second embodiment of the present invention.

A second embodiment of the present invention will be described below. As shown in FIG. 6, the second embodiment includes a light source 101 formed of an excimer laser light source, a half mirror 102 for splitting a laser beam from the light source 101 into a first laser beam P and a second laser beam Q which transmit different optical paths, a so-called halving 103 for controlling the phase of at least one laser beam of the first and second laser beams P and Q so that the first and second laser beams P and Q may have a predetermined phase difference therebetween, a half mirror (beam splitter) for synthesizing the first and second laser beams P and Q and a reduction projection lens 105 constructing an objective projection optical system. The halving 103 is the device that can control the optical path length of light and arranged such that a phase of laser beam transmitted therethrough can be inverted by 180°. As the halving 103, there can be utilized such one that is a well known λ/2 wave plate, for example. Reference numerals 113 and 114 depict total reflection mirrors, respectively.

A mask mount for holding the first photo mask 6 is disposed on the optical path of the first laser beam P between the half mirror 102 and the total reflection mirror 113. A mask mount 109 for holding the second photo mask 108 is disposed on the optical path of the second laser beam Q between the total reflection mirror 114 and the half mirror 104. A wafer chuck 111 is supported on the XY stage 112 and disposed under the reduction projection lens 105.

The mask mounts 107, 109 are movable in any of the X, Y and Z directions and adjustable for rotation and inclination in the XY plane independently of each other.

Therefore, the first photo mask 106 and the second photo mask 108 each can be disposed accurately in a desired position on the optical paths of the first and second laser beams p and Q, respectively.

FIGS. 7A, 7B and FIGS. 8A, 8B show the first photo mask 196 and the second photo mask 108 utilized in this embodiment for achieving the same effects as those of the Levenson type, which is the typical phase shift method.

Figure 7A:
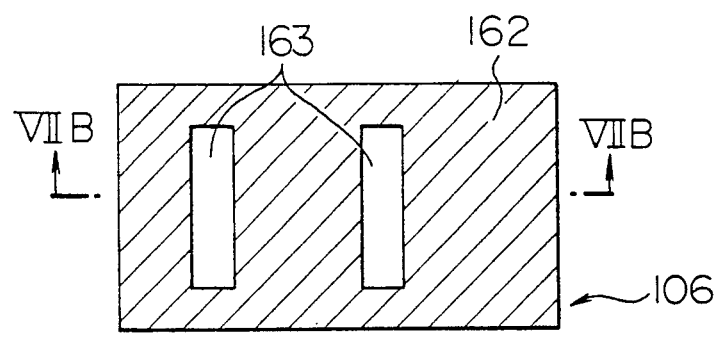
FIG. 7A is a plan view of a first photo mask element utilized in the second embodiment.
Figure 7B:
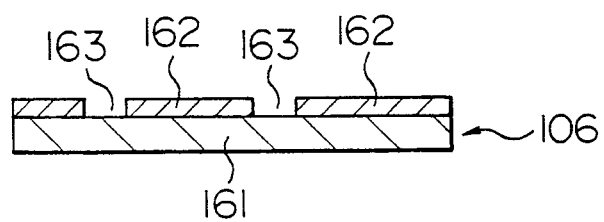
FIG. 7B is a cross-sectional view taken along the line VIIB—VIIB of FIG. 7A.
Figure 8A:
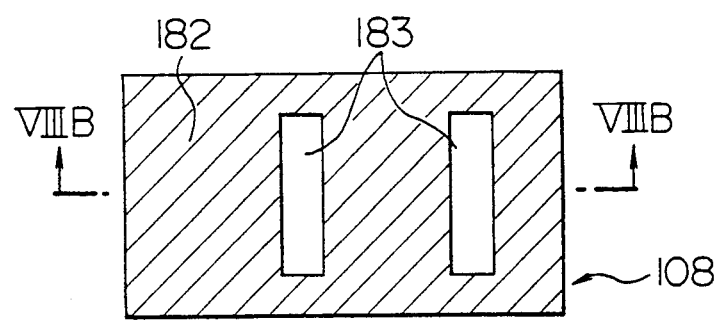
FIG. 8A is a plan view of the second photo mask element utilized in the second embodiment.
Figure 8B:
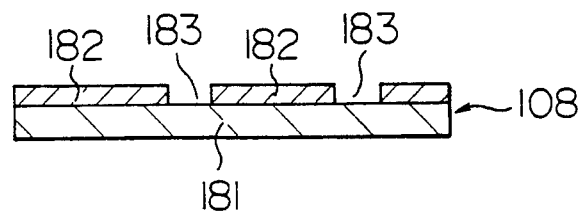
FIG. 8B is a cross-sectional view taken along the line VIIIB—VIIIB of FIG. 8A.

As shown in FIGS. 7A, 7B, the first photo mask 106 includes a pattern of a film 162 made of a light shielding material such as chromium and formed on the surface of a glass substrate 161 made of a quartz or the like. Also, as shown in FIGS. 8A, 8B, the second photo mask 108 includes a pattern of a phase shift film 182 made of a transparent thin film and formed on the surface of a glass substrate 181 made of a quartz glass or the like. The first and second photo masks 106 and 108 for reduction projection exposure according to this embodiment have enlarged patterns generally called as an enlarging mask or reticle.

The pattern of the first photo mask 106 and the pattern of the second photo mask 108 are formed so as to provide a predetermined exposure pattern on the substrate when optically synthesized. More specifically, the transmission portion 163 having no light shielding film 162 of the first photo mask 106 and the transmission portion 183 having no light shielding film 182 of the second photo mask 108 are alternately arranged when the respective patterns are projected onto the substrate by the first and second laser beams P and Q. Then, the pattern obtained by synthesizing both the patterns is coincident with a pattern that is to be projected for exposure onto the substrate.

In the apparatus of this embodiment, as shown in FIG. 6, a coherent light from the light source 101 is splitted into the first and second laser beams P and Q. The first laser beam P is transmitted through the first photo mask 106, and reflected by the total reflection mirror 113 toward the half mirror 104. Further, the second laser beam Q is inverted in phase by 180° by the halving 103, reflected by the total reflection mirror 114, transmitted through the second photo mask 108 and then reaches the half mirror 104. Therefore, the pattern of the first photo mask 106 and the pattern of the second photo mask 108 are optically synthesized and the synthesized pattern is projected in reduced size by the reduction projection lens 105 on the wafer 110 (or various thin films that were already formed on the wafer 110). While the wafer 110 is progressively moved in the X and Y directions by the XY stage 112, the reduction projection is repeated and the whole surface of the wafer 110 is exposed by repeating the above step.

Figure 10:
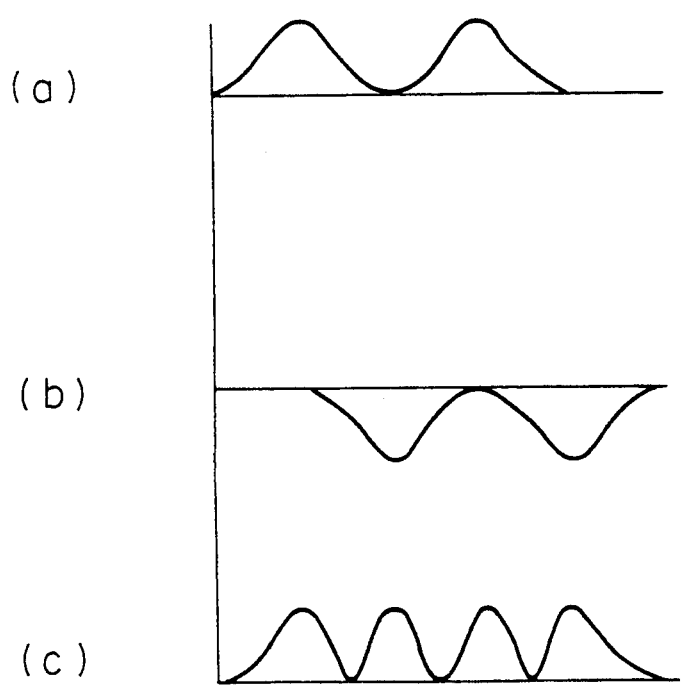
FIGS. 10(a), 10(b) and 10(c) are diagrams showing a distribution of intensity of light transmitted through the pattern of the first photo mask element, a distribution of intensity of light transmitted through the pattern of the second photo mask element and a distribution of intensity of a synthesized light, respectively.
Figure 15:
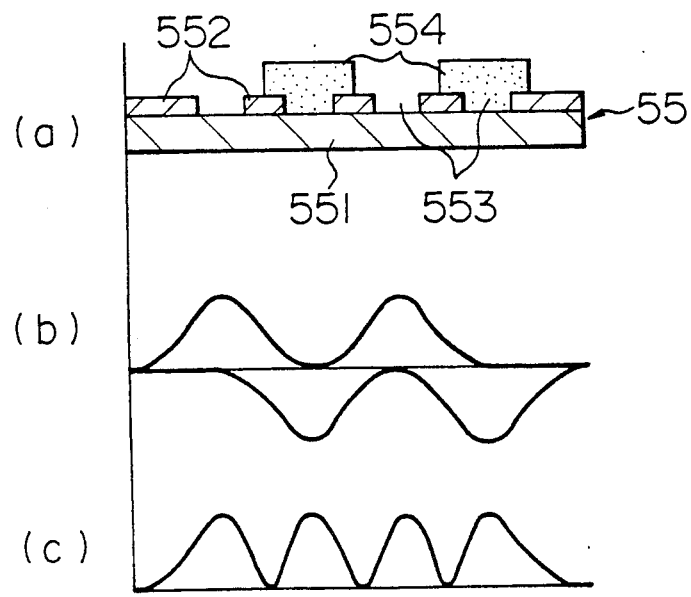
FIGS. 15(a), 15(b) and 15(c) are a cross-sectional view of a conventional phase shift mask and a distribution of intensity of light transmitted through the phase shift mask and a distribution of intensity of a synthesized light projected onto the substrate.

In the above projection exposure, as shown in FIG. 10(a), the first laser beam P transmitted through the respective transmission portions 163 of the first photo mask 106 is spread widthwise with a phase unchanged. Also, the second laser beam Q transmitted through the respective transmission portions 183 of the second photo mask 108 is spread widthwise with a phase which is inverted opposingly to the phase of the first laser beam P. That is, although the second photo mask 108 is a mask having the pattern of only the light shielding film, the second photo mask 108 provides, in combination with the second laser beam Q whose phase is inverted, the same function as the phase shift mask having the phase shift film. Then, the pattern of the first photo mask 106 produced by the first laser beam P and the pattern of the second photo mask 108 produced by the second laser beam Q are synthesized. On the wafer 110, as shown in FIG. 10(c), the light intensities at the boundaries of every adjacent two portions of the pattern become zero and the respective pattern portions are separated. A study of FIGS. 10(a), 10(b) and 10(c) reveals that the same effects as those obtained by using the phase shift mask 55 having the pattern of the light shielding film 552 and the pattern of the phase shift film 554 shown in FIG. 15 can be realized by utilizing the first photo mask 106 having only the pattern of the light shielding film 162 and the second photo mask 108 having only the pattern of the light shielding film 182.

Although the phase of one laser beam is controlled as described above, the present invention is not limited thereto and the phases of both laser beams may be controlled. Further, although the laser beam is controlled in phase and then transmitted through the photo mask as described above, the present invention is not limited thereto and the laser beam may be transmitted through the photo mask and then controlled in phase.

As described above, according to the embodiment of the present invention, by transmitting the split first and second laser beams whose phase difference is controlled through the first and second photo masks, respectively, and projecting a synthesized pattern of the first photo mask pattern and the second photo mask pattern, it is possible to realize, by utilizing the two photo masks having a pattern of only the light shielding film in a single-layer structure, the same effects as those of the phase shift method utilizing the conventional phase shift mask of two-layer structure of the light shielding film and the phase shift film. Accordingly, in this embodiment, instead of the conventional phase shift mask, which is very difficult in manufacturing process and inspection and correction of the defect due to the necessity of high accuracy film control, the inexpensive and well-known photo mask (such as chromium mask) can be utilized. Therefore, it is possible to reduce greatly the cost of the phase shift method and to effectively apply the 10 invention to manufacturing process of semiconductor devices in actual practice.

Figure 11:
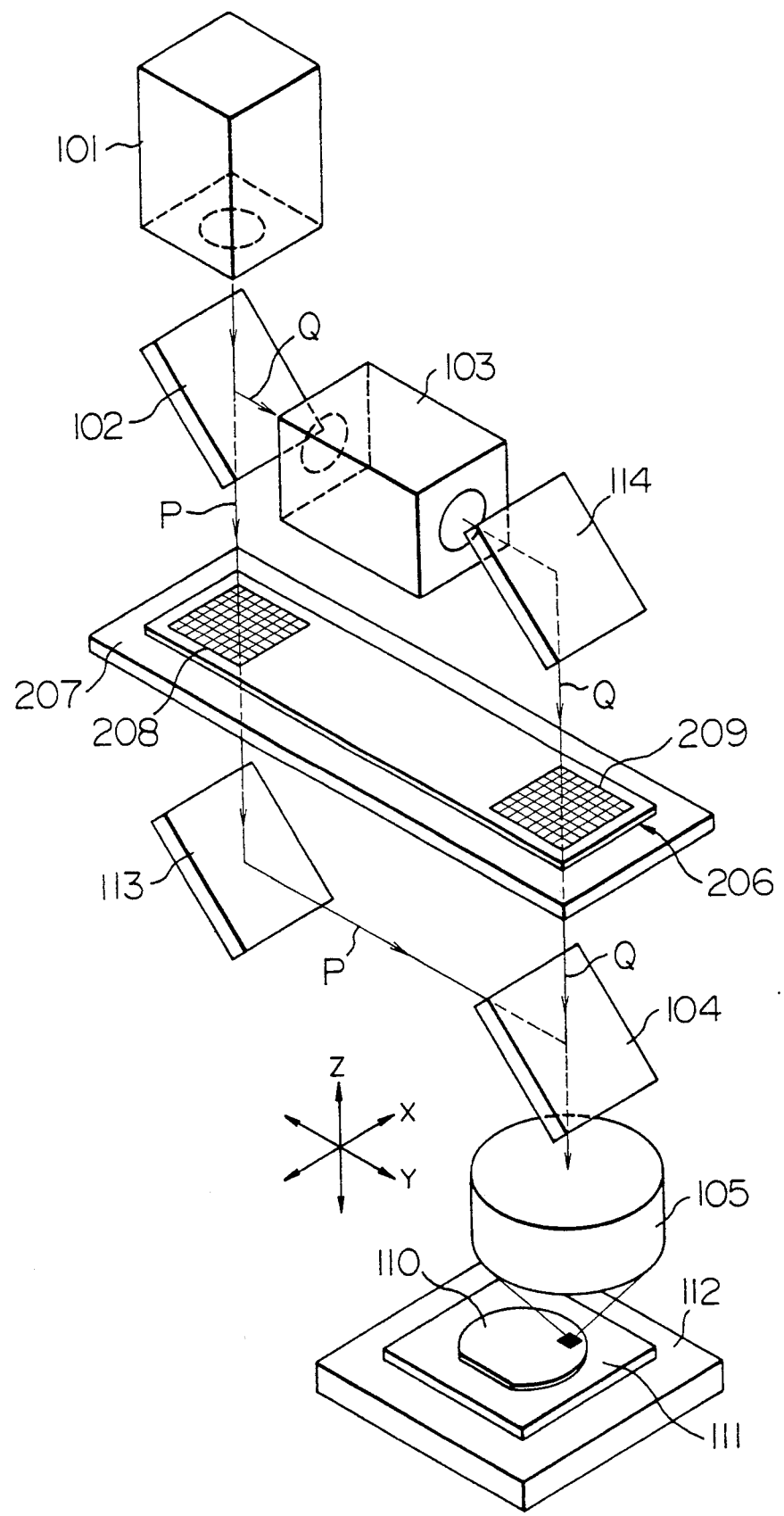
FIG. 11 is a perspective view schematically showing an arrangement of a projection exposure apparatus according to a third embodiment of the present invention.

A third embodiment of the present invention will be described with reference to FIG. 11. In FIG. 11, like parts corresponding to those of FIG. 6 are designated by the same reference numerals. The third embodiment is the same as the second embodiment except that the third embodiment utilizes, in place of the first and second photo masks 106, 108 and the mask mounts 107, 109 for holding the first and second photo masks 106 and 108 in the second embodiment, one photo mask 206 having a first area (first photo mask element) 208 and a second area (second photo mask element) 209 and one mask mount 207 for holding the photo mask 206. The mask mount 207 is movable in any of the X, Y and Z directions and adjustable for rotation and inclination in the XY plane independently of each other. Thus, the first and second areas 208 and 209 of the photo mask 206 can be accurately positioned on the optical paths of the first and second laser beams P and Q, respectively.

Figure 9:
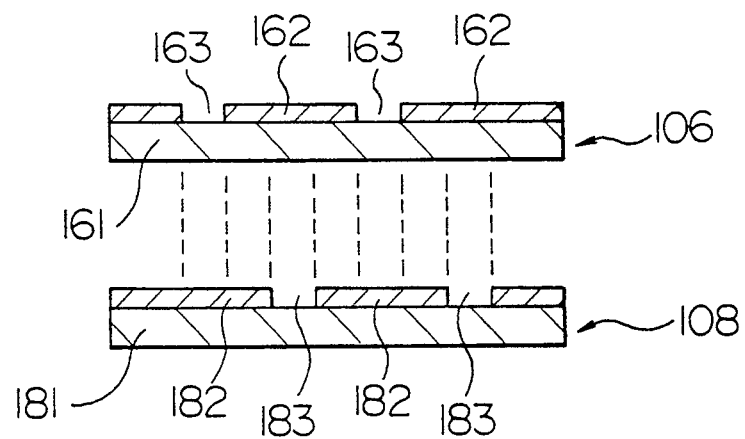
FIG. 9 is a diagram showing a relationship in optical position between the first pattern of the first photo mask element shown in FIG. 7A and the second pattern of the second photo mask element shown in FIG. 8A.
Figure 12A:
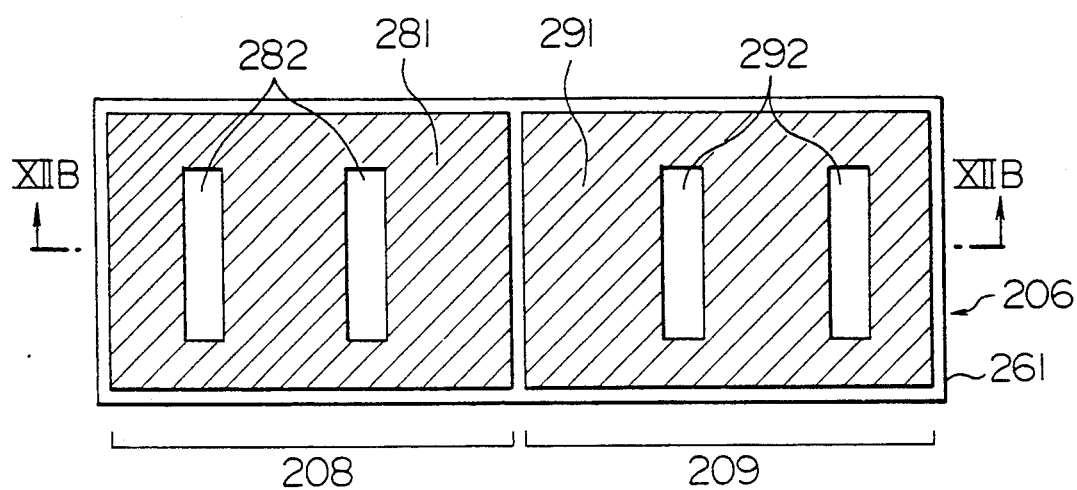
FIG. 12A is a plan view of a photo mask apparatus utilized in the third embodiment.
Figure 12B:
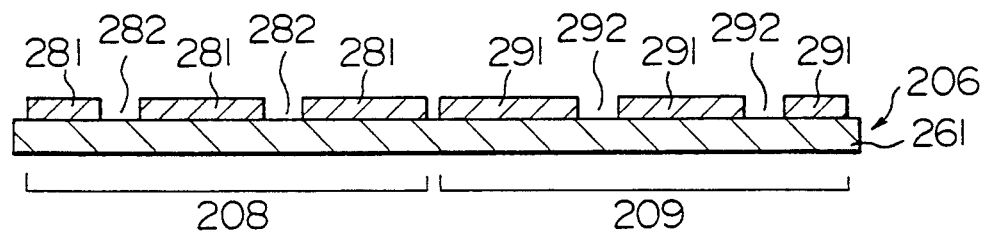
FIG. 12B is a cross-sectional view taken along the line XIIB—XIIB of FIG. 12A.
Figure 13:
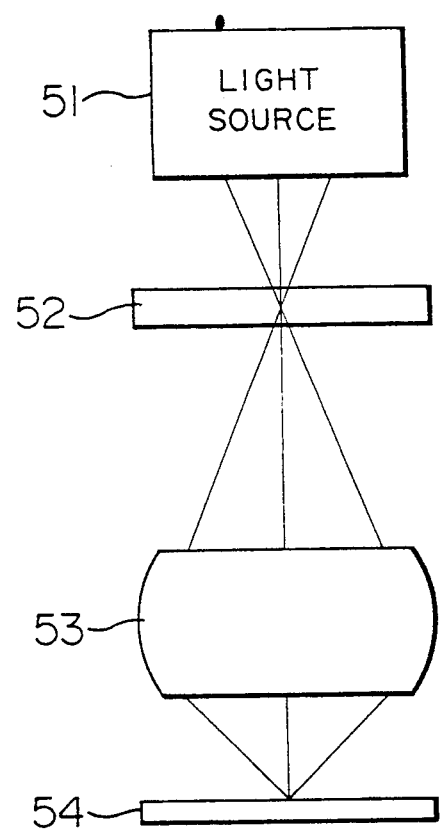
FIG. 13 is a diagram showing an arrangement of a conventional projection exposure apparatus.
Figure 14:
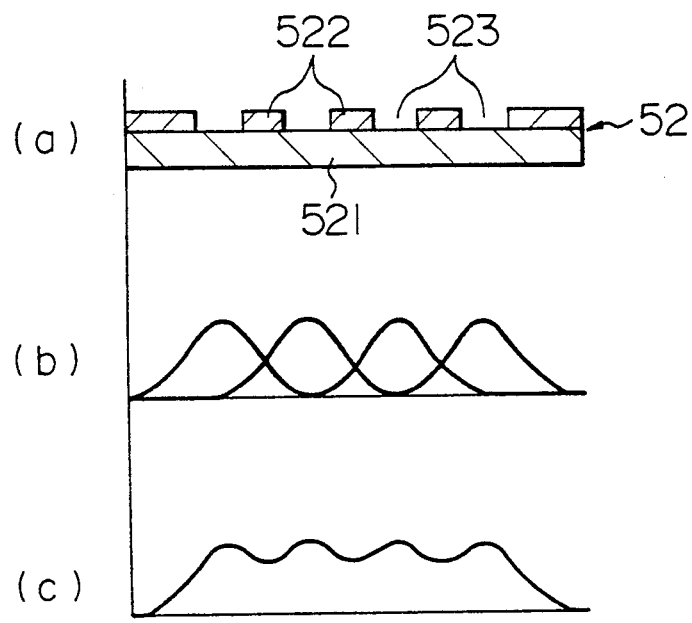
FIGS. 14(a), 14(b) and 14(c) are a cross-sectional view of a conventional photo mask and diagrams showing a distribution of light transmitted through the photo mask and a distribution of intensity of a synthesized light projected onto a substrate.

As shown in FIG. 12A and 12B, the photo mask 206 includes the first area 208 in which a pattern of a film 281 made of a light shielding material such as a chromium film is formed on the surface of a glass substrate made of a material such as a quartz glass and the second area 209 in which a pattern of a light shielding film 291 is formed. A positional relationship between the first and second patterns is the same as the positional relationship between the pattern of the light shielding film of the first photo mask 106 and the pattern of the light shielding film of the second photo mask 109 in the second embodiment. Therefore, according to the third embodiment, similarly to the second embodiment, a synthesized pattern of the pattern of the first area and the pattern of the second area is projected for exposure onto the substrate and the adjacent pattern portions are separated in the same-manner as described above with reference to FIGS. 9 and 10.

Having described preferred embodiments of the invention with reference to the accompanying drawings, it is to be understood that the invention is not limited to those embodiments and that various changes and modifications could be effected therein by one skilled in the art without departing from the spirit or scope of the invention as defined in the appended claims.

What is claimed is:

1. A projection exposure method comprising the steps:
    projecting patterns of first and second photo mask elements by a light including a coherent component onto a substrate, each photo mask element having a pattern of a single-layer structure of one of the phase shift film and the light shielding film said substrate being disposed at a predetermined position such that an optical synthesized pattern of the two patterns is formed on said substrate; and
    controlling a phase of at least one of a first light portion, which projects the pattern of said first photo mask element onto said substrate, and a second light portion, which projects the pattern of said second photo mask element onto said substrate, so that said first light portion and said second light portion have a predetermined phase difference therebetween.

2. A projection exposure method comprising the steps of:
    focusing an image of a first pattern image formed on a first photo mask element at a first predetermined position by using a light including a coherent component; and
    projecting for exposure an optical synthesized pattern of a second pattern formed on a second photo mask element disposed at said first predetermined position and the image of said first pattern of said first photo mask element onto a substrate disposed at a second predetermined position by using said light, wherein one of said first and second patterns is formed of a light shielding film and the other pattern corresponds to at least one selected portion of said one pattern and is formed of a phase shift film.

3. A projection exposure apparatus comprising:
    a light source for emitting a light including a coherent component;
    first and second photo mask elements, each having a pattern of a single layer structure of one of a phase shift film and a light shielding film;
    positioning means for mounting and positioning a substrate at a predetermined position;
    means for projecting the patterns of said first and second photo mask elements by the light to said substrate so that an optical synthesized pattern of the two patterns is formed on said substrate; and
    means for controlling a phase of at least one of a first light portion, which projects the pattern of said first photo mask element on said substrate, and a second light portion, which projects the pattern of said second photo mask element on said substrate, so that said first light portion and said second light portion have a predetermined phase difference therebetween.

4. A projection exposure apparatus comprising:
a light source for emitting a light including a coherent component;
photo mask means including a first photo mask element having a predetermined first pattern formed thereon and a second photo mask element having a predetermined second pattern formed thereon;
means for holding a substrate at a predetermined position; and
optical means for focusing an image of said first pattern onto said second photo mask by using the light from said light source and for projecting for exposure an optical synthesized pattern of the focused first pattern and the second pattern of said second photo mask element onto said substrate,
wherein one of said first and second patterns is formed of a light-shielding film and the other pattern corresponds to at least one selected portion of said one pattern and is formed of a phase shift film.

5. A projection exposure method comprising the steps of: splitting a light including a coherent component from a light source into first and second lights transmitted through two different optical paths;
controlling a phase of at least one of said first and second lights such that said first and second lights have a predetermined phase difference therebetween;
disposed photo mask means including first and second photo mask elements having first and second patterns, respectively, for forming a predetermined pattern when synthesized so that said first light is transmitted through said first photo mask element and said second light is transmitted through said second photo mask element;
synthesizing said first light transmitted through said first photo mask element and said second light transmitted through said second element to form a synthesized light carrying said predetermined pattern; and
projecting for exposure said synthesized light carrying said predetermined pattern on a film made of a photosensitive material onto a substrate.

6. A projection exposure method according to claim 5, wherein said phase difference is 180°.

7. A projection exposure method according to claim 5, wherein said step of controlling a phase is applied to only one of said first and second lights.

8. A projection exposure method according to claim 7, wherein said step of controlling a phase is carried out before the one of said first and second lights is transmitted through an associated one of first and second areas.

9. A projection exposure apparatus comprising:
means for splitting a light including a coherent component from a light source into first and second lights transmitted through two different optical paths;
means for controlling a phase of at least one of said first and second lights so that said first and second lights have a predetermined phase difference therebetween;
photo mask means having first and second areas on which first and second pattern portions are formed, respectively, to provide a predetermined pattern, when synthesized and disposed so that said first light is transmitted through said first area and said second light is transmitted through said second area;
means for synthesizing said first light transmitted through said first area and said second light transmitted through said second area to form a synthesized light carrying said predetermined pattern; and
means for projecting for exposure said synthesized light carrying said predetermined pattern on a film made of a photosensitive material onto a substrate.

10. A projection exposure apparatus according to claim 9, wherein said phase difference is 180°.

11. A projection exposure apparatus according to claim 9, wherein said phase control means controls a phase of only one of said first and second lights.

12. A projection exposure apparatus according to claim 11, wherein said photo mask means is disposed such that said one light transmits through an associated one of said first and second areas after the phase of said one light has been controlled by said phase control means.

13. A projection exposure apparatus comprising:
a light source for emitting a light including a coherent component;
first and second photo mask elements, each having a pattern of a single layer structure of one of a phase shift film and a light shielding film;
positioning means for mounting and positioning a substrate at a predetermined position;
means for projecting the patterns of said first and second photo mask elements by the light onto said substrate so that an optical synthesized pattern of the two patterns is formed on said substrate; and
means for determining a phase difference between a first light portion, which projects the pattern of said first photo mask element onto said substrate, and a second light portion, which projects the pattern of said second photo mask element onto said substrate.

14. An apparatus according to claim 13, wherein said determining means includes a λ/2 wave plate.

15. An apparatus according to claim 14, wherein said λ/2 wave plate shifts said first light portion.

* * * * *